(12) United States Patent
Felps

(10) Patent No.: US 6,225,930 B1
(45) Date of Patent: May 1, 2001

(54) REFERENCE LOOP FOR A DIGITAL-TO-ANALOG CONVERTER

(75) Inventor: Jimmie D Felps, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/314,090

(22) Filed: May 18, 1999

(51) Int. Cl.$^7$ ...................................................... H03M 1/66
(52) U.S. Cl. ............................................................. 341/144
(58) Field of Search ..................................... 341/144, 152, 341/153, 154

(56) References Cited

U.S. PATENT DOCUMENTS 5,041,831   8/1991   Bohley et al. ........................ 341/144
5,764,173 *  7/1998   Flynn ................................... 341/152

* cited by examiner

Primary Examiner—Brian Young

(57) ABSTRACT

An improved reference loop for a digital-to-analog converter (DAC) uses an approximate 50% duty cycle to improve the DC performance and the drift of the DAC at mid-scale. The 50% duty cycle also allows the DAC to provide the same performance over all outputs irrespective of the number of bits supplied to each input. The 50% duty cycle for the reference loop may be obtained from one of the DAC system outputs by forcing that output to supply a square wave output signal which may be used as input for the reference loop. The reference loop may alternatively be supplied by a DAC clock that is divided to obtain the desired 50% duty cycle input to the reference loop, in which case all outputs of the DAC are available for system output.

23 Claims, 3 Drawing Sheets

REFERENCE LOOP FOR A DIGITAL-TO-ANALOG CONVERTER

TECHNICAL FIELD

The present invention relates generally to electronic circuitry, and, more particularly, to an improved reference loop for a digital-to-analog converter (DAC).

BACKGROUND OF THE INVENTION

In many programmable electronic and electrical devices it is desirable to convert a digital signal into an analog signal. A new DAC was developed and described in commonly assigned U.S. Pat. No. 5,041,831, entitled "INDIRECT D/A CONVERTER", and issued on Aug. 20, 1991 to Bohley et al., which is hereby incorporated by reference. In the above-mentioned '831 Patent, a plural channel indirect DAC is supplied with data words containing address bits and data bits, which are entered into a specific one of the converter's channels under control of the address bits of the data word. The data bits are applied to a binary rate multiplier of the channel which generates a pulse modulated output signal representing the binary value of the received data bits. The pulse modulated output signal is applied to an associated filter which converts the pulse modulated output signal to an analog output signal whose amplitude represents the binary value of the received data bits. Gating circuitry ensures that each output pulse is of a precisely controlled pulse width.

In a particular application, the indirect DAC has 16 output channels, although the indirect DAC may have a greater or fewer number of channels depending upon application. Each of the 16 channels are 16-bit DACs. If all 16 bits are used, the lowest frequency that will be filtered is 10 MHz/$2^{16}$, or 10 MHz/65536, or 152.6 Hz. When used as a 12-bit DAC, the lowest frequency to be filtered is 10 MHz/$2^{12}$, or 10 MHz/4096, or 2.441 kHz. It is desirable to tailor each output filter to match the lowest frequency to be filtered so as to minimize the settling time when going from one DAC setting to the next. Using the minimum number of data bits for a DAC channel for the particular application is desirable to help minimize the filter settling time.

One of the DAC channels is used to calibrate the output level of the filters. This channel is referred to as the reference loop. The number of data bits applied to the different channels may need not be the same and may vary in number from a minimum of 1 to a maximum of m.

A drawback in the above-mentioned indirect DAC is that it divides the input clock by 2 before using it for the DAC channels. This clock division is unnecessary since only the period of the clock is used for timing. Unfortunately, this condition doubles the settling time of all the DAC filters since they could have been running at 20 MHz (the integrated circuit process limit) instead of 10 MHz.

Another drawback of the above-mentioned DAC is that it requires one of the DAC output channels be used to supply the filter that comprises the reference loop, the output of which is used to calibrate the output level of the remaining filters on the remaining DAC channels.

Another drawback of the above-mentioned DAC is that, depending upon the number of bits with which the reference channel is programmed (i.e., the number of bits programmed to 1s), there will be a different offset voltage present on each of the other channels. This different offset voltage occurs because the above-mentioned DAC does not behave like a conventional DAC when the reference channel is programmed to all 1s (a hexadecimal code of FFFF for a 16-bit DAC).

When all 1s are programmed in the reference loop, the digital output is high for 65535 counts of the 10 MHz clock period, or 65535/10 MHz, or 6.5535 milliseconds (ms) and low for 1 count, or 1/10 MHz, or 100 nanoseconds (ns). The average voltage of this waveform is compared to the reference voltage, in this case 5V. This means that an all 1s input gives the reference voltage as output, not 1 q-level less than the reference voltage that would be expected from a conventional DAC. A q-level on a conventional 16-bit DAC would be equal to +5V/$2^{16}$, or 5/65536, or 76 microvolts ($\mu$V). In the indirect DAC with the reference loop programmed to all 1s for 16 bits, a q-level would be equal to +5V/($2^{16-1}$), or 5/65535, or 76 uV. In a 16-bit DAC, the error is insignificant, but it does cause the other DAC outputs to be ½ of a q-level high when programmed at mid-scale. This equates to a hexadecimal code 8000 which is a square wave, or (5/65535)(6553612), or 2.500038 V instead of the expected 2.500 V. If the reference channel is programmed for all 1s for 8 bits (hexadecimal code FF00), the error increases and would be equal to $\{5/(2^{8-1})\}\{(2^8/2)\}$, or (5/255)(256/2), or 2.509804 V not 2.500 V. This offset voltage error is particularly troublesome and confusing when the reference loop of different DACs have been programmed to different numbers of bits.

A third drawback is that the above-mentioned DAC is most accurate and exhibits the lowest drift with temperature on DAC channels that are operating under the same conditions as the reference loop, i.e. all 1s at 16 bits (if that is how the reference loop is programmed), or at full scale, +5V. Most DAC applications require a DAC to operate at or near mid-scale and be programmable above and below mid-scale. Generally it is desirable to have the highest accuracy and lowest drift near this mid-scale operating point. As mentioned above, this is not the case when the reference loop is programmed with all 1s. The 8 most significant bits of the indirect DAC simply vary the duty cycle of the clock divided by $2^8$, or 10 MHz/256, or 39.0625 kHz. Therefore, for all DAC codes on an 8-bit DAC, the digital output always operates at 39 kHz. In this instance, mid-scale would be a square wave and occur at 39 kHz for all DAC channels regardless of the number of data bits used since the DAC code would be 8000 for all channels. The rise and fall times and the number of transitions of the digital output also affect the offset voltage errors.

Therefore, it would be desirable to provide a way to program the reference loop (which in turn will calibrate all of the other DAC channels) such that whatever the number of input bits for each channel, an all 1s input will result in an output of one q-level below the reference voltage and a mid-scale code of 8000 (a square wave) will result in an output of ½ the reference voltage. Furthermore, it would be desirable for the most accurate and lowest drift to occur at the mid-scale output of the DAC (approximately 2.5V), and without using one of the DAC output channels as the input to the reference loop.

SUMMARY OF THE INVENTION

The invention provides an improved indirect DAC reference loop. In architecture, the present invention may be conceptualized as an improved digital-to-analog converter (DAC) including a plurality of DAC outputs, the improvement comprising: an input clock supplied to the DAC, the input clock operating at a first frequency, the input clock divided to a second frequency and coupled to a reference loop.

The present invention may also be conceptualized as a method for operating a reference loop in a DAC having a plurality of outputs, each output having a maximum output corresponding to a system voltage, the method comprising the steps of: supplying the reference loop with a clock signal, the clock signal supplied to the reference loop such that all of the plurality of DAC outputs are available as system outputs; and operating the reference loop at a 50% duty cycle.

The invention has numerous advantages, a few of which are delineated below merely as examples.

An advantage of the invention is that it allows all of the output channels of a DAC to be used as system outputs.

Another advantage of the invention is that it allows the reference loop to operate at a 50% duty cycle, resulting in all DAC channels having the best accuracy and lowest temperature drift near mid-scale, where the best accuracy is normally desired.

Another advantage of the invention is that when the reference loop is operating at a 50% duty cycle, all the channels will behave like a conventional DAC, where all 1s will be 1 q-level less than full scale, regardless of the number of bits used in a channel.

Another advantage of the invention is that when the reference loop is operating at a 50% duty cycle, mixing DAC channels of different numbers of bits causes no offset voltage to occur on channels that use a different number of bits.

Another advantage of the invention is that it is simple in design and easily implemented on a mass scale for commercial production.

Other features and advantages of the invention will become apparent to one with skill in the art upon examination of the following drawings and detailed description. These additional features and advantages are intended to be included herein within the scope of the present invention.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION OF THE INVENTION

The improved DAC reference loop of the present invention can be implemented in hardware, software, firmware, or a combination thereof. In the preferred embodiment(s), the improved DAC reference loop is implemented in hardware. Furthermore, while described as useful in an oscilloscope, the improved DAC reference loop can be used in any application requiring the use of DACs.

Figure 1:
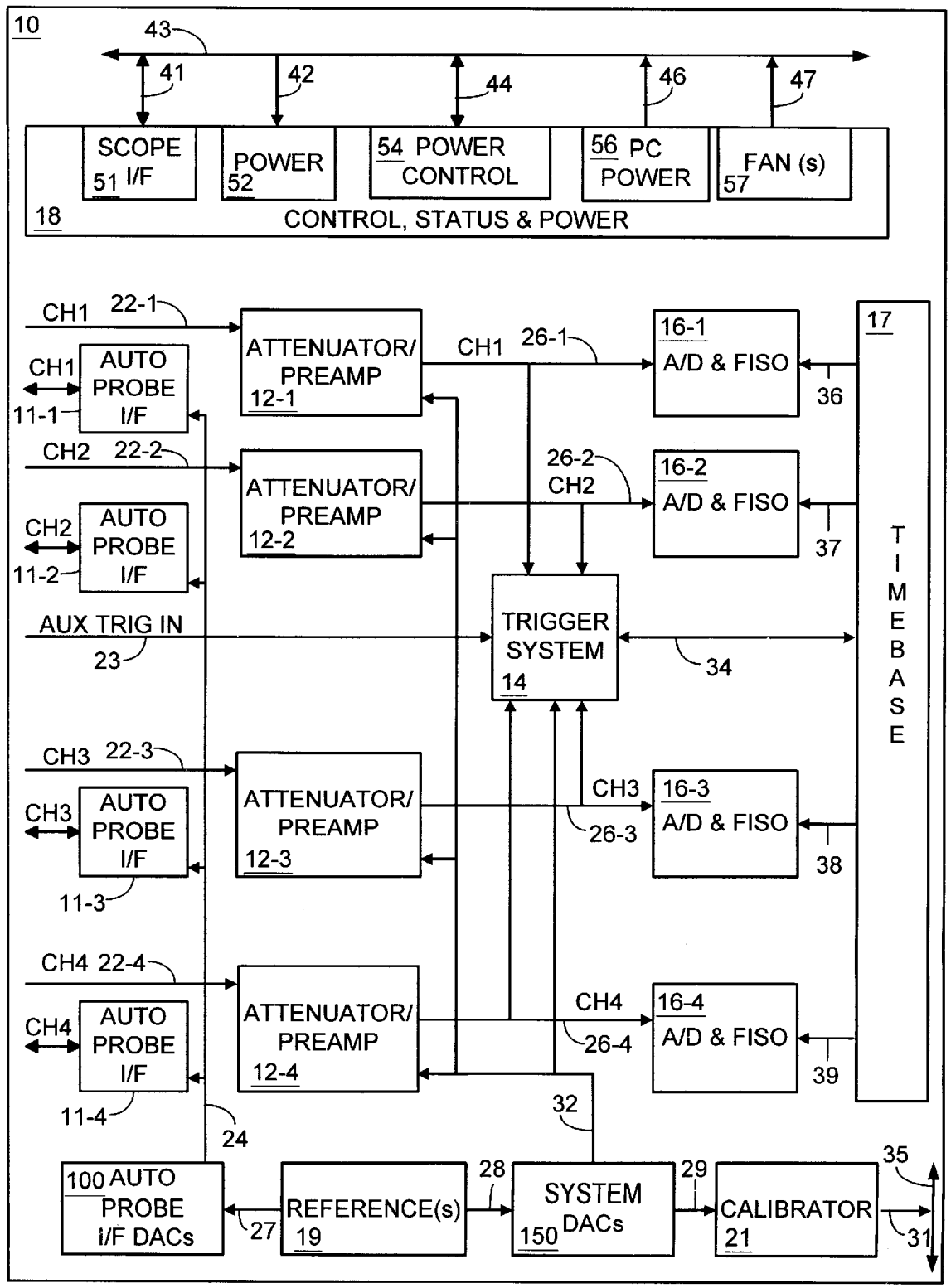
FIG. 1 is a block diagram illustrating an oscilloscope in which the DACs of the present invention reside.

Turning now to FIG. 1, shown is a block diagram view of a typical oscilloscope acquisition system 10. Oscilloscope acquisition system 10 resides within an oscilloscope (not shown) and provides calibration and reference for an oscilloscope and for probes connected to the oscilloscope. Included in acquisition system 10 is control, status and power module 18. Control, status and power module 18 includes a number of modules which communicate with other components of the oscilloscope via interface 43. Included in control, status and power module 18 is power module 52 which receives power over connection 42 from interface 43. Also included in control, status and power module 18 is scope interface (I/F) module 51. Scope I/F module 51 communicates with interface 43 over connection 41 to control various functions, and to monitor the status, of the acquisition system. Power control module 54 communicates with interface 43 over connection 44 to provide power control to oscilloscope acquisition system 10. Personal computer (PC) power module 56 delivers power over connection 46 from interface 43 and provides conditioned power to a PC (not shown) embedded in the oscilloscope. Fan module 57 provides appropriate fan drive signals over connection 47 through interface 43 to provide cooling to the oscilloscope in which the oscilloscope acquisition system 10 is located.

Also included in oscilloscope acquisition system 10 are a plurality of autoprobe I/F modules 11 and a plurality of attenuator/preamp modules 12. The autoprobe I/F module 11 is an active and passive probe interface that provides power, offset voltage and control to compatible probes to automate the setup for the oscilloscope for the particular probes being used. The attenuator/preamp module 12 provides the appropriate signal conditioning, which may include signal attenuation and/or amplification and input signal buffering for driving the A/D & fast-in-slow-out (FISO) module 16 and the trigger system module 14. Oscilloscope acquisition system 10 may include a plurality of channels 22 each representing a channel over which the oscilloscope acquisition system 10 communicates with the various probes that might be used to provide signals to the oscilloscope. While four channels are illustrated in FIG. 1, it is possible that many different number channels may be contained within oscilloscope acquisition system 10.

For example, channel 22-1 provides an analog signal in the range of 0 to +/−250V peak, at a frequency in the range of DC to 500 MHz to attenuator/preamp 12-1. Attenuator/preamp 12-1 attenuates and preamplifies the signal supplied over connection 22-1 and provides over connection 26-1 a signal to both trigger system 14 and A/D & FISO module 16-1. A/D and FISO module 16-1 also receives a timing signal over connection 36 from timebase module 17. Timebase module 17 provides a variety of timing signals appropriate for converting the CH1 analog signal at connection 26-1 to a digital representation. An auxiliary trigger input, which provides an alternative trigger source in addition to the four channels, CH1–CH4, for oscilloscope triggering, is also supplied over connection 23 to trigger system 14. Trigger arming, resetting and synchronization are accomplished by the timebase module 17 over connection 34.

Oscilloscope acquisition system 10 also includes a variety of DACs, each of which include the improved reference loop of the present invention. For example, reference module 19 communicates over connection 27 to autoprobe I/F DACs 100, and communicates over connection 28 to system DACs 150. Both autoprobe I/F DACs 100 and system DACs 150 are digital-to-analog converters that benefit from the improved reference loop of the present invention, which will be described in detail with respect to FIGS. 2 and 3. System DACs 150 communicate over connection 29 with calibrator 21, which sends a calibration signal over connection 31 to bus 35 (which are external connections) for calibrating the oscilloscope and for calibrating active and passive probes when used in conjunction with the autoprobe I/F DACs 100. Autoprobe I/F DACs 100 send analog signals over connection 24 to autoprobe I/F modules 11, while system DACs 150 send analog signals over connection 32 to attenuator/preamp modules 12 and trigger system 14.

Although the autoprobe I/F DACs 100 and the system DACs 150 are similar in design, different DAC output ranges are scaled for the particular application. For example, some DAC outputs are unipolar, some are bipolar, and some DAC outputs are current outputs. The autoprobe I/F DACs 100 aid in performing such functions as generating offset voltages for active probes and implementation of an ohmmeter for measuring the probe identification resistor, probe ID, present in active and passive probes. The system DACs 150 control trigger levels and hysteresis in the trigger system 14 as well as offset voltages to the attenuator/preamp modules 12.

It should be noted herein that while described with reference to autoprobe I/F DACs 100 and system DACs 150 located within an oscilloscope, the improved reference loop of the present invention can be used with any application using a DAC. Furthermore, while illustrated as single elements, autoprobe I/F DACs 100 and system DACs 150 typically each include a plurality of DACs.

Figure 2:
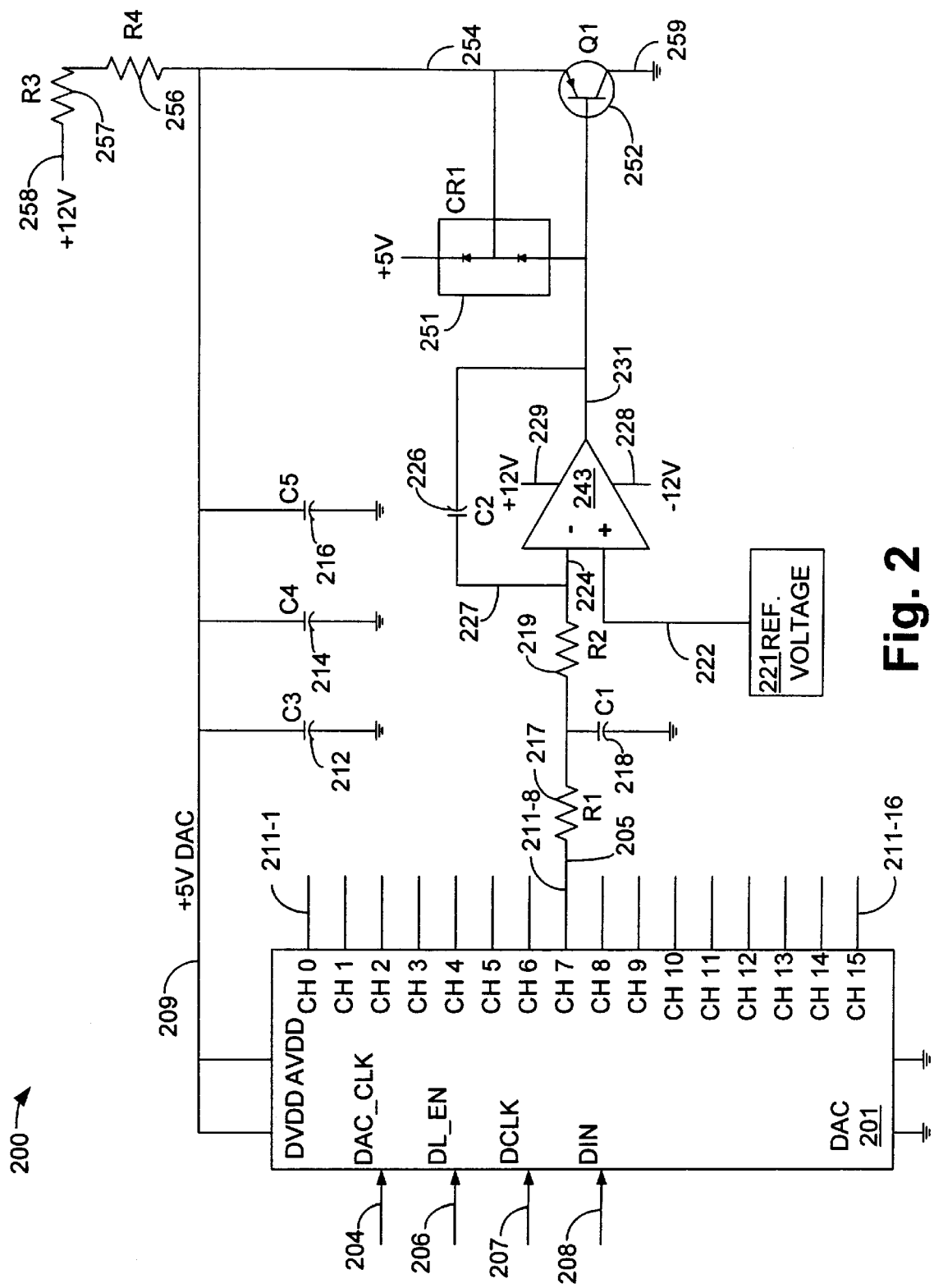
FIG. 2 is a schematic view of one of the DACs of FIG. 1 including one embodiment of the improved DAC reference loop of the present invention.

FIG. 2 is a schematic view illustrating the improved DAC reference loop 200 of the present invention. DAC 201 represents an indirect DAC as described in above-mentioned U.S. Pat. No. 5,041,831, and will not be described in detail. Briefly described, DAC 201 receives a programmable digital input over connection 208 and supplies a 16-bit digital pattern on each of 16 output channels 211-1 through 211-16. The digital patterns on connections 211-1 to 211-16 are then filtered to obtain a DC voltage that represents that pattern. The output of DAC 201 is inherently monotonic in that if a bit is added to the input, then the output will either stay the same or increase. Similarly, if one bit is subtracted from the input, then the output will either stay the same or decrease. That is to say that the monotonicity of the output of DAC 201 assures that the output will not move opposite that of the input. If a bit is added to the input, then the output will not decrease and if a bit is subtracted from the input, then the output will not increase. Each DAC channel 211-1 to 211-16 can be, in this embodiment, a maximum of 16 bits, each channel being individually controllable. It should be noted that while described as having 16 channels, DAC 201 may have a greater or fewer number of channels depending upon application.

The output of each channel is a digital signal whose pattern is representative of a 16 bit word, with any number of those bits being high and low. For example, for a 16 bit channel, as illustrated in the '831 Patent, the output of each channel 211 is a digital signal switching between 0 and 5V with a pulse width that varies in 100 ns steps from being 0V DC to being 0V for 100 ns and at 5V for 65535*100 ns, or 6.5535 ms. Typically one DAC channel, in this case channel 7, which is reference numeral 211-8, is used as a reference loop. Any DAC channel may be used as the reference loop. The reference loop supplies a precise 5V DC supply to DAC 201 over connection 209.

As stated above, one q-level for a 16 bit channel is approximately 76 µv, while one q-level for an 8 bit DAC channel is approximately 19 mV. Because of the discrepancy caused by the manner in which the reference loop is programmed, in the past, programmers had difficulty programming DACs that had the reference loop programmed to different numbers of bits. The DAC 201 of U.S. Pat. No. 5,041,831 describes the reference channel as operating at all 1s. This condition causes the output swings of the channels to be slightly higher than the 5V reference because the all is pattern is 100 ns at 0V and 6.5535 ms at the high level, the average of which is regulated to 5V. In certain applications where fewer than 16 bits are programmed at all 1s, the outputs swing even higher. The present invention solves this problem by operating the reference channel at precisely a 50% duty cycle, which corresponds to hexadecimal code 8000 (where the 16 bits would be 1000 0000 0000 0000, where the "1" is the most significant bit). When combined with a 2.5V reference voltage, a true 0–5V swing will occur at each output.

Typically, the reference channel, as stated above with respect to channel 211-8, was programmed with some number of bits high such that close to a 5V supply was delivered to DAC 201 over connection 209. However, that arrangement causes a q-level to be $5/2^{n-1}$, where n is the number of bits programmed to all 1s, instead of the more desirable $5/2^n$, which condition causes an error in the average output voltages to exist on all DAC channels. The error ranges between none at an input code of 0000 to an error of one full q-level at an input code of FFFF for 16 bits.

In accordance with the invention, the reference channel 211-8 over connection 205 is operated at a 50% duty cycle. When the reference loop is operating at a 50% duty cycle, it is not necessary to have a programmable reference loop. The reference loop merely needs to be the input clock divided down to a square wave that is the same frequency as each DAC channel 211 when programmed to a code of 8000.

Another manner in which the reference loop may be operated at a 50% duty cycle is to supply a DAC code of hex 8000 on the DAC channel supplying the reference loop, in this case DAC channel 211-8. The hex code of 8000 provides a square wave, which represents a 50% duty cycle output of DAC 201 on channel 211-8. When the reference loop is operating at a 50% duty cycle, all of the DAC channels will have the highest possible accuracy and lowest temperature drift near mid-scale where the best accuracy is normally desired. Mid-scale refers to a voltage level of approximately 2.5V, which represents the mid-point of a 5V swing. In accordance with an aspect of the invention, when the reference loop is operating at a 50% duty cycle, all DAC channels will behave in a manner in which a DAC channel of all 1s output will be exactly one q-level less than fill scale, regardless of the number of bits used in the DAC channel. For example, in a 16 bit DAC channel, where one bit represents 76 µv, 16 1s will generate a full scale voltage of full scale less one q-level. If the number of bits in the DAC channel were 8, then 8 1s in that channel will generate full scale voltage less one q-level, or full scale less 19 mV. In this manner, it is possible to have one DAC 201 having output channels in which a different number of bits are present, in which no output error will occur in the reference channel.

In accordance with the invention, the output of DAC channel 211-8 is supplied over connection 205 to resistor R1 217 (100 KΩ). Capacitor C1 218 (100 nF) and resistor R2 219 (100 KΩ), supply the inverting input of operational amplifier (op-amp) 243. In the preferred embodiment, a 2.5V reference voltage 221 is supplied over connection 222 to the non-inverting input of op-amp 243. Op-amp 243 is also supplied with a +12 volt supply voltage over connection 229 and a –12 volt supply voltage over connection 228. The output of op-amp 243 on connection 231 is fed back through capacitor C2 226 (47 nF) in feedback loop 227 to the inverting input 224 of op-amp 243. The output of op-amp 243 is also supplied to optional voltage clamp 251. Voltage clamp 251 may be used to limit the output voltage if desired. The output of op-amp 243 is also supplied to transistor Q1 252, the emitter 254 of which controls a +12 V source on connection 258 in order to supply calibrated 5V power to DAC 201 over connection 209. Transistor Q1 252 is connected to +12 V voltage supply over connection 258 through resistors R3 257 (287Ω) and R4 256 (287Ω). While depicted as discrete resistors to improve power dissipation, resistors R3 and R4 may alternatively be a single resistor.

Capacitor C3 212 (47 nF), C4 214 (47 nF) and C5 216 (47 uF) between connection 209 and ground serve to de-couple and isolate the 5V supply voltage to DAC 201. While values for the components are illustrated in FIG. 2, it should be understood that these component values may be altered depending upon desired application. Furthermore, while illustrated in FIGS. 2 and 3 using discrete resistors, all the resistors may reside within a precision resistor package.

Figure 3:
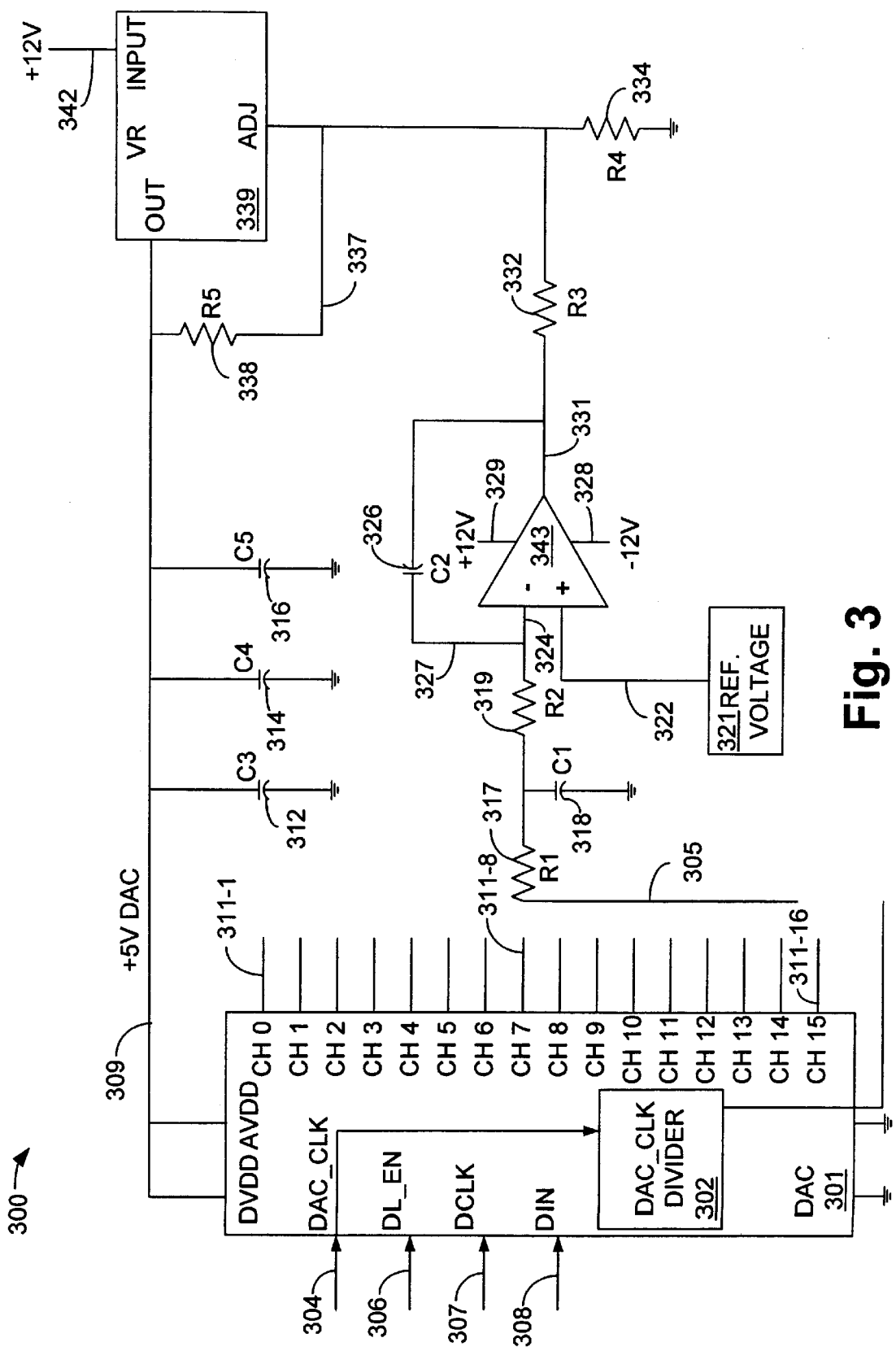
FIG. 3 is a schematic view of one of the DACs of FIG. 1 including an alternative embodiment of the improved DAC reference loop of the present invention.

FIG. 3 is a schematic view illustrating an alternative embodiment 300 of the improved reference loop of the present invention. Elements in FIG. 3 that are similar in function to those in FIG. 2 are numbered similarly. For example, while a reference numeral in FIG. 2 might say 2XX the similar element in FIG. 3 would be referred to as 3XX.

In a departure from that described with respect to FIG. 2, the improved reference loop 300 of FIG. 3 is supplied with a divided DAC clock input signal on connection 305. The DAC_CLK input on connection 304 is illustratively 20 MHz, which is divided by 2 by components (not shown) within DAC 301 such that a 10 MHz clock signal is supplied to DAC_CLK divider 302. The DAC_CLK divider 302 divides the 10 MHz DAC_CLK signal by some number, for example, 256, to supply a reference output over connection 305 to the reference loop of the present invention. The division ratio of the DAC_CLK divider 302 should be adjusted such that the output frequency of the square wave on connection 305 is at the same frequency that occurs at output channels 311 when the channels are programmed with code 8000. Dividing by 256 presents the same frequency to the reference loop as is supplied to the DAC channels when set for hexadecimal code 8000. The input clock is not divided by 2 prior to clocking all the DAC channels. Therefore, if a 20 MHz DAC_CLK clock signal is used, 1 q-level would equal 50 ns on each DAC output channel. Then, in similar fashion to that described with respect to FIG. 2, the improved reference loop 300 supplies a 5V supply voltage to DAC 301 over connection 309. In this manner, all 16 channels 311-1 through 311-16 of DAC 301 are available as system outputs because, in this embodiment, the reference channel does not use one of the DAC output channels, i.e., channel 211-8, as it did with respect to FIG. 2.

Still referring to FIG. 3, should excessive noise be present in the 12 V power supply 258 of FIG. 2, then a voltage regulator 339 can be used to set the nominal voltage on connection 309 to 5V, while op-amp 343 uses the reference output on connection 305 to make the precise correction so that precisely 5V is supplied over connection 309 to DAC 301. In this embodiment, op-amp 343 provides approximately a +/-10% correction to the nominal voltage supplied by voltage regulator 339, so as to prevent excessive voltage on DAC 301 prior to loading the appropriate code into DAC output 311-8 (if the voltage regulator 339 is used in the embodiment discussed with respect to FIG. 2, or in a situation where the reference loop is not functioning properly). It should be mentioned that the voltage regulator may be used with the improved reference loop of FIG. 2.

Still referring to FIG. 3, resistors R3 332 (6.19 KΩ) and R4 334 (383Ω) form a −24.7 dB divider that limits the voltage correction ability of op-amp 343 to approximately +/-10%. Therefore, capacitor C2 326 is reduced to 2.7 nF to maintain the unity gain loop crossover at the same point.

There are three poles in this reference loop 300. It is desirable to cross unity gain in the loop with adequate phase margin so that the loop will be stable, i.e. not oscillate. The first pole is created by R1 317 in parallel with R2 319 and C1 318. For these component values, the pole occurs at ½pi*{100e3*/(100e3/(100e3+100e3)}(100e−9), or 31.8 Hz. The second pole is created by R1 317 plus R2 319, C2 326 and op-amp 343. This forms an integrator with unity gain and 90 degrees of phase shift at ½pi*(100e3+100e3)(47e−9), or 16.9 Hz. The third pole is created by the output impedance of voltage regulator 339 (or emitter follower Q1 252 in FIG. 2) and capacitors C3 312, C4 314 and C5 316. Capacitors C3, C4 and C5 are chosen to be as large as possible to lower the impedance of connection 309 to as low a frequency as possible, yet at a frequency that is higher than the unity gain loop cross-over point so as not to add excessive loop phase shift at the cross-over point. Since the output impedance is less than 13 ohms in each case, the third pole is equal to or greater than ½pi*(13)(47e−6), or 260 Hz. The frequency of the waveform from DAC 301 (or DAC 201 in FIG. 2) through connection 305 (or connection 205 in FIG. 2) that is filtered is 10 MHz/($2^{16}$), or 10 MHz/65536, or 152.6 Hz for a reference loop using 16-bit all 1s and a 5V reference, and 10 MHz/($2^8$), or 10 MHz/256, or 39.1 kHz for a reference loop using a square wave and a 2.5V reference. The integrator op-amp 343 should set the unity gain loop cross-over with the other two poles occurring at a higher frequency.

Referring back to FIG. 2, the reference loop 200, if using a 5V reference, has only a slight amount of attenuation around the loop except for integrator op-amp 243. Therefore, when C2 226 is set to 100 nF, the unity gain loop cross-over is approximately equal to the frequency where the capacitive reactance of C2 226 is equal to the resistance of R1 217 plus R2 219, or ½pi*(100e3+100e3)(100e−9), or ½pi*(200e3)(100e−9), or 7.96 Hz. To maintain that same cross-over frequency with the circuit in FIG. 2 with a square wave and a 2.5V reference, there is an attenuation of 6 dB, or a factor of 2 out of DAC channel 211-8 from the power supply at connection 209, i.e., 2.5V average out when a square wave. Therefore, capacitor C2 226 should preferably be approximately half the prior value, or 47 nF.

Referring again to FIG. 3, with the additional attenuation of 24.7 dB, or a factor of 17.16 in the loop 300 caused by resistors R3 332 and R4 334, the value of capacitor C2 326 should be reduced by an additional factor of 17.16 to approximately 2.9 nF, or to a standard value of 2.7 nF. This keeps all reference feedback loops stable and crossing the unity gain frequency at approximately the same point of approximately 8 Hz. One skilled in feedback loop art would be able to develop different, but equally suitable reference feedback loop configurations.

As illustrated in FIG. 3, voltage clamp 251 and transistor Q1 252 of FIG. 2 have also been eliminated.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of the present invention.

What is claimed is:

1. An improved digital-to-analog converter (DAC) reference loop, comprising:
   a reference voltage coupled to said reference loop; and
   a signal coupled to said reference loop causing said reference loop to operate substantially at a 50% duty cycle, where said signal is coupled to said reference loop from one of a plurality of DAC outputs.

2. The DAC reference loop of claim 1, wherein said reference voltage is a mid-scale voltage.

3. The DAC reference loop of claim 1, wherein said reference voltage is 2.5V.

4. The DAC reference loop of claim 1, further comprising a divider configured to divide an input clock having a first frequency to a second frequency, said second frequency coupled to said reference loop such that all DAC outputs are available as system outputs.

5. The DAC reference loop of claim 4 wherein said second frequency is a square wave.

6. A method for operating a reference loop in a digital-to-analog converter (DAC) having a plurality of outputs, each output having a maximum output, the method comprising the step of:
   supplying said reference loop with a first signal such that said reference loop operates substantially at a 50% duty cycle; and
   supplying said reference loop with a reference signal, where said step of operating said reference loop at a 50% duty cycle results in each of said plurality of DAC outputs providing an output that is one q-level less than said maximum output.

7. The method of claim 6, wherein said reference voltage is a mid-scale voltage.

8. The method of claim 6, wherein said reference voltage is 2.5V.

9. The method of claim 6, wherein said first signal is supplied to said reference loop by one of said plurality of DAC outputs.

10. The method of claim 6, wherein said first signal is supplied by a clock divider in said DAC.

11. The method of claim 6, wherein said 50% duty cycle input is a square wave clock signal.

12. The method of claim 10, wherein the use of said clock divider in said DAC to supply said first signal allows each of said plurality of DAC outputs to be available for system use.

13. An improved digital-to-analog converter (DAC) reference loop, comprising:
   a reference voltage coupled to said reference loop;
   a signal coupled to said reference loop causing said reference loop to operate substantially at a 50% duty cycle; and
   a divider configured to divide an input clock having a first frequency to a second frequency, said second frequency coupled to said reference loop such that all DAC outputs are available as system outputs.

14. The DAC reference loop of claim 13, wherein said reference voltage is a mid-scale voltage.

15. The DAC reference loop of claim 13, wherein said reference voltage is 2.5V.

16. The DAC reference loop of claim 15, wherein said second frequency is a square wave.

17. A method for operating a reference loop in a digital-to-analog converter (DAC) having a plurality of outputs, each output having a maximum output, the method comprising the steps of:
   supplying said reference loop with a first signal such that said reference loop operates substantially at a 50% duty cycle, wherein said 50% duty cycle input is a square wave clock signal; and
   supplying said reference loop with a reference signal.

18. The method of claim 17, wherein said reference voltage is a mid-scale voltage.

19. The method of claim 17, wherein said reference voltage is 2.5V.

20. The method of claim 17, wherein said step of operating said reference loop at a 50% duty cycle results in each of said plurality of DAC outputs providing an output that is one q-level less than said maximum output.

21. The method of claim 20, wherein said first signal is supplied to said reference loop by one of said plurality of DAC outputs.

22. The method of claim 20, wherein said first signal is supplied by a clock divider in said DAC.

23. The method of claim 22, wherein the use of said clock divider in said DAC to supply said first signal allows each of said plurality of DAC outputs to be available for system use.

* * * * *